(12) United States Patent
Hörold

(10) Patent No.: US 6,548,627 B1
(45) Date of Patent: Apr. 15, 2003

(54) FLAME-RETARDANT PHOSPHORUS-MODIFIED EPOXY RESINS

(75) Inventor: Sebastian Hörold, Erftstadt (DE)

(73) Assignee: Clariant GmbH, Frankfurt (DE)

( * ) Notice: Subject to any disclaimer, the term of this patent is extended or adjusted under 35 U.S.C. 154(b) by 0 days.

(21) Appl. No.: 09/552,068

(22) Filed: Apr. 19, 2000

(30) Foreign Application Priority Data

Apr. 19, 1999 (DE) .......................... 199 17 428

(51) Int. Cl.$^7$ .............................................. C08G 70/04
(52) U.S. Cl. ...................... 528/398; 252/609; 428/413; 528/89; 528/93; 528/108
(58) Field of Search .......................... 252/609; 528/108, 528/89, 93, 398; 428/413

(56) References Cited

U.S. PATENT DOCUMENTS

| | | | |
|---|---|---|---|
| 4,617,584 A | * 10/1986 | Ikeya et al. | |
| 5,115,005 A | * 5/1992 | Horner | 523/451 |
| 5,587,243 A | 12/1996 | von Gentzkow et al. | |
| 5,624,979 A | 4/1997 | Kleiner et al. | 523/453 |
| 5,648,171 A | 7/1997 | von Gentzkow et al. | |
| 5,773,533 A | 6/1998 | Horold | 525/533 |
| 5,830,973 A | * 11/1998 | Horold et al. | 428/413 |
| 5,837,771 A | * 11/1998 | Wipfelder et al. | 524/786 |
| 5,854,361 A | 12/1998 | Horöld et al. | |
| 5,854,371 A | * 12/1998 | Horold | 428/413 |
| 5,880,247 A | 3/1999 | Horold et al. | 528/108 |
| 5,900,469 A | 5/1999 | Kleiner et al. | |
| 5,959,043 A | 9/1999 | Horold et al. | 525/533 |
| 6,420,459 B1 | 7/2002 | Horold | 523/451 |

FOREIGN PATENT DOCUMENTS

| | | | |
|---|---|---|---|
| DE | 26 52 007 | 5/1978 | |
| EP | 0 794 205 | 9/1997 | |
| EP | 806426 A2 | * 11/1997 | ......... C07F/09/655 |
| WO | WO 98/13407 | 4/1998 | |
| WO | WO 98/31538 | 7/1998 | |

OTHER PUBLICATIONS

Internet site: http://www.acdlabs.com/iupac/nomenclature/93/r93_309.htm.*
Internet site: http://www.chem.qmw.ac.uk/iupac/class/PAsSb.html.*
Derwent Patent Family Abstract for DE 43 08 184.
Derwent Patent Family Abstract for WO 98/13407.
Derwent Patent Family Abstract for DE 26 52 007.
"Grant and Hackh's Chemical Dictionary, fifth edition", 1987, McGraw–Hill, pp. 24 and 53.*

* cited by examiner

Primary Examiner—Robert Dawson
Assistant Examiner—Marc S Zimmer
(74) Attorney, Agent, or Firm—Anthony A. Bisulca

(57) ABSTRACT

The present invention relates to novel flame-retardant phosphorus-containing epoxy resins with an epoxy value of from 0.05 to 1.0 moll 100 g containing structural units which derive from (A) polyepoxy compounds having at least two epoxy groups per molecule, and (B) organic phosphinic acids.

The invention further relates to a process for their preparation, and to their use. Besides their flame retardancy, the novel flame-retardant phosphorus-containing epoxy resins have especially good storage stability.

14 Claims, No Drawings

FLAME-RETARDANT PHOSPHORUS-MODIFIED EPOXY RESINS

BACKGROUND OF THE INVENTION

The present invention relates to novel flame-retardant phosphorus-containing epoxy resins, to a process for their preparation, and to their use. Besides their flame retardancy, the novel phosphorus-containing epoxy resins have especially good storage stability.

Epoxy resins are currently used to prepare molding compositions and coatings with a high level of thermal, mechanical and electronic properties. They are suitable for potting electrical or electronic components and for saturation processes and impregnation processes. The epoxy resins used in electrical engineering are mainly flame-retardant and used for printed circuitboards and insulators.

Epoxy resins for printed circuitboards have hitherto been rendered flame-retardant by including bromine-containing aromatic compounds in the reaction, in particular tetrabromobisphenol A. A disadvantage is that hydrogen bromide is liberated in the event of fire, and this can cause corrosion damage. Under unfavorable conditions, polybrominated dibenzodioxins and furans can also be produced. Considerable technical resources are required for the risk-free disposal of these printed circuitboards by incineration after their use.

The use of aluminum hydroxide is limited by the release of water at higher temperatures. PCT WO 98/31538 describes the use of aluminum hydroxide as flame retardant for NEMA (National Electrical Manufacturers Association) CEM 3 epoxy resin laminates. However, for NEMA FR-4 and FR-5 qualities it has not hitherto been possible to use aluminum hydroxide.

An effective way of rendering epoxy resins flame-retardant is to use organophosphorus compounds. However, compounds which are not bonded by a reaction can migrate out of the laminates and impair the electrical properties. Epoxy resins having chemically bonded phosphorus can be obtained by reacting epoxy resins with organophosphorus compounds having P-OH groups, with addition of the P-OH group to the oxirane ring. This gives phosphorus-modified epoxy resins which remain reactive and can be cured using conventional hardeners.

DE-A 26 52 007 describes the reaction of epoxy resins with phospholanes.

DE-A 43 08 184 describes epoxy resin mixtures made from an aromatic polyamine as hardener and from a phosphorus-modified epoxy resin. This phosphorus-modified epoxy resin is composed of structural units which derive from polyepoxy compounds and from at least one compound selected from the group consisting of phosphinic acids, phosphonic acids, pyrophosphonic acids and phosphonic half-esters.

DE-A 43 08 187 likewise describes epoxy resin mixtures made from an aromatic polyamine as hardener and from a phosphorus-modified epoxy resin. This phosphorus-modified epoxy resin is composed of structural units which derive from polyepoxy compounds and from phosphinic anhydrides and/or phosphonic anhydrides.

DE-A 196 13 066 describes phosphorus-modified epoxy resins made from polyepoxy compounds and from phosphinic or phosphonic acids containing carboxyl groups.

The chemical incorporation of phosphorus compounds into epoxy resins must firstly bring about sufficient flame retardancy and must secondly avoid impairing the mechanical, chemical and electrical properties of the cured resins.

Any reduction in the adhesion of fabrics during prepreg or composite production likewise has to be avoided. Finally, epoxy resin solutions and prepregs for industrial use must have sufficient storage-stability. There is therefore a need for improvement in the provision of epoxy resins with halogen-free flame retardants.

SUMMARY OF THE INVENTION

The object of the present invention is to render epoxy resins flame-retardant using phosphorus compounds which are easily obtainable industrially and have a high phosphorus content, the moldings obtained from these epoxy resins after appropriate curing having good mechanical and electrical properties.

The phosphorus-containing epoxy resins, which do not as yet comprise any hardener, are to have adequate storage stability, even in solution. The method of use of the resultant epoxy resins should be similar to that for the materials currently used in industry, i.e. the resins should not be difficult to use.

DESCRIPTION OF THE PREFERRED EMBODIMENTS

The object is achieved by means of flame-retardant phosphorus-modified epoxy resins with an epoxy value of from 0.05 to 1.0 mol/100 g containing structural units which derive from (A) polyepoxy compounds having at least two epoxy groups per molecule, and (B) organic phosphinic acids.

It is preferable for the organic phosphinic acids to have the formula (I) and for the organic monoalkylated/arylated phosphinic acids to have the formula (II)

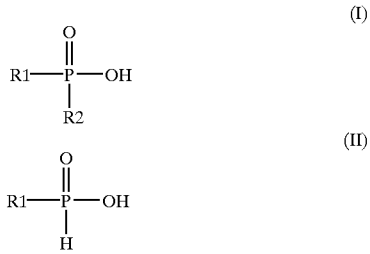

where for formula (I) R1 and R2 are identical or different and each is an alkyl group having from 1 to 10 carbon atoms or an aryl group having from 2 to 10 carbon atoms, and in formula (3) R1 is an alkyl group having from 1 to 10 carbon atoms or an aryl group having from 2 to 10 carbon atoms.

It is preferable for R1 and R2 to be identical or different and for each to be a methyl or ethyl group.

It is preferable for the novel flame-retardant phosphorus-modified epoxy resins to contain, on average, at least one epoxy group.

It is preferable for the novel flame-retardant phosphorus-modified epoxy resins to contain from 1 to 8% by weight of phosphorus.

The object is also achieved by means of a process for preparing flame-retardant phosphorus-modified epoxy resins from epoxy resins and organic phosphinic [or phosphonous] acids as in formula (I) or (II), which comprises reacting the polyepoxy compounds of (A) and the organic phosphinic acids of (B) with one another.

It is preferable for the reaction to take place in a solvent.

It is preferable for polar aprotic solvents to be used, for example N-methylpyrrolidone, dimethylformamide, tetrahydrofuran, dioxane, ethers, such as dialkyl ethers and glycol ethers, ketones, such as methyl ethyl ketone, and/or esters, such as ethyl acetate.

It is preferable for the reaction with the phosphinic acids as in formula (I) to take place at temperatures of from 70 to 100° C.

The reaction with the monoalkylated/arylated phosphinic acids as in formula (II) takes place first at temperatures from 80 to 120° C. until the acid function has been consumed in the reaction and then continues at temperatures of from 150 to 180° C., in the presence of catalysts.

It is preferable for the catalysts used to be phosphonium salts, ammonium salts, metallocenes and/or Lewis acids.

It is preferable for the ratio of equivalents between polyepoxy compound (A) and organic phosphinic acids (B) to be from 1:0.1 to 1:1.

The molar ratio between polyepoxy compound and phosphorus compound may be varied to give reaction products with different phosphorus contents and epoxy values.

The invention further provides the use of the novel flame-retardant phosphorus-modified epoxy resins for producing moldings, composites, coatings or laminates.

As described above, the reaction of the phosphinic acids takes place at temperatures of from 70 to 100° C. and can be monitored by measuring the acid number.

The reaction with monoalkylated/arylated phosphinic acids of the formula (II), in contrast, proceeds in two stages. The acid function first reacts with the epoxy group at temperatures of from 80 to 120° C. Once this reaction has finished, the temperature is increased to from 150 to 180° C. and catalysts added, so that the P—H group reacts with the epoxide, The reaction can be followed by $^{31}$P-NMR spectroscopy.

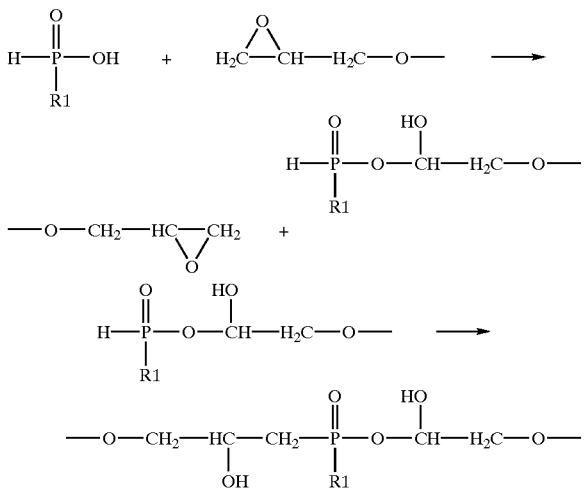

FIG. 1: Reaction scheme for the reaction of phosphonous acids with polyepoxy compounds.

It is useful for the monofunctional phosphinic acids of the formula (I) to be reacted with polyepoxy resins of functionality three or above, for example epoxidized novolaks.

The bifunctional monoalkylated/arylated phosphinic acids, in contrast, give better results when reacted with bifunctional epoxy resins.

The phosphorous-modified epoxy resings obtained by the novel process may- as described- be used to produce laminates, composites, molding, or coatings.

Epoxy resins are compounds prepared by a polyaddition reaction between an epoxy resin component and a crosslinking (hardener) component. The epoxy resin component used is an aromatic polyglycidyl ether, such as bisphenol A diglycidyl ether, bisphenol A diglycidyl ether, a polyglycidyl ether of a phenol-formaldehyde resin or of a cresol-formaldehyde resin, a polyglycidyl ester of phthalic, isophthalic, terephthalic or trimellitic acid, an N-glycidyl compound of an aromatic amine or of a heterocyclic nitrogen base, or else a di- or polyglycidyl compound of a polyhydric aliphatic alcohol.

The hardeners used are polyamines such as triethylenetetramine, aminoethylpiperazine and isophoronediamine, polyamidoamines, a polybasic acid or anhydride of these, e.g. phthalic anhydride, hexahydrophthalic anhydride, methyl tetrahydrophthalic anhydride, or phenols. The crosslinking may also be brought about by polymerizing with the use of suitable catalysts. The hardener mostly used for printed circuitboards is dicyandiamide.

The fire protection requirement for electrical and electronic equipment is laid down in a variety of specifications and standards for product safety. In the U.S., flame-retardancy testing and approval is undertaken by Underwriters Laboratories (UL). The UL specifications are nowadays accepted worldwide. The fire tests for plastics were developed in order to determine the resistance of the materials to ignition and flame spread. Depending on the fire protection requirements, the materials have to pass horizontal burning tests (Class UL 94 HB) or the more stringent vertical tests (UL 94 V-2, V-1 or V-0). The tests simulate low-energy ignition sources which arise in electrical devices and which can affect plastic parts in electrical assemblies.

EXAMPLES

The examples below describe the invention:

Example 1
(Methanephosphonous Acid)

200 g of a liquid bisphenol A epoxy resin with an epoxy value of 0.55 mol/100 g and a functionality of 2 are mixed with 16 g of methanephosphonous acid (0.2 mol) in a 250 ml five-necked flask with reflux condenser, stirrer shaft, thermometer and gas infeed pipe. While the mixture is stirred under a stream of nitrogen the temperature is increased to 100° C. and held at this temperature for about 1 h. The progress of the reaction is followed by measuring the acid number. 0.4 g of tetramethylphosphonium bromide is added, and then the temperature is increased to 150° C. After about 2 h of reaction time at 150° C. the reaction mixture is allowed to cool and diluted with 40 g of methyl ethyl ketone, giving a colorless, viscous solution. The $^{31}$P-NMR spectrum shows a number of lines between 50 and 60 ppm typical of phosphinic acids.

Example 2
(Ethanephosphonous Acid)

200 g of a liquid bisphenol A epoxy resin with an epoxy value of 0.55 mol/100 g are mixed with 19 g of ethanephosphonous acid (0.2 mol) in a 250 ml five-necked flask with reflux condenser, stirrer shaft, thermometer and gas infeed pipe. While the mixture is stirred under a stream of nitrogen the temperature is increased to 100° C. and held at this temperature for about 1 h. The progress of the reaction is followed by measuring the acid number. 0.4 g of tetramethylphosphonium bromide is added, and then the temperature is increased to 150° C. After about 2 h of reaction time at 150° C. the reaction mixture is allowed to cool and diluted with 40 g of methyl ethyl ketone, giving a colorless, viscous solution. The $^{31}$P-NMR spectrum shows a number of lines between 50 and 60 ppm typical of phosphinic acids.

Example 3

(Diethylphosphinic Acid)

200 g of an epoxidized novolak with an epoxy value of 0.56 mol/100 g and an average functionality of 3.6 are dissolved in 80 g of methyl ethyl ketone and mixed with 24 g of diethylphosphinic acid in a 250 ml five-necked flask with reflux condenser, stirrer shaft, thermometer and gas infeed pipe. While the mixture is stirred under a stream of nitrogen the temperature is increased to 100° C. and held at this temperature for about 1 h. The product has an epoxy value of 0.39 mol/100 g.

Example 4

(Methyl Ethylphosphinic Acid)

200 g of an epoxidized novolak with an epoxy value of 0.56 mol/100 g and an average functionality of 3.6 are dissolved in 80 g of methyl ethyl ketone and mixed with 24 g of methylethylphosphinic acid in a 250 ml five-necked flask with reflux condenser, stirrer shaft, thermometer and gas infeed pipe. While the mixture is stirred under a stream of nitrogen, the temperature is increased to 100° C. and held at this temperature for about 1 h. The product has an epoxy value of 0.39 mol/100 g.

The resultant phosphorus-modified epoxy resin solutions have surprisingly good storage-stability. After 6 months of storage at room temperature the viscosity and epoxy value of the epoxy resin solutions are virtually unchanged.

The epoxy resins obtainable in this way have excellent flame retardancy, as demonstrated in the examples below.

Example 5

125 g of epoxy resin solution as in Example 1 and 30 g of Dyhard L 10 (SKW Trostberg, solution of dicyan-diamide in methylglycol), and also 0.1 g of Dyhard MI (SKW Trostberg), are used to impregnate, dry and prereact glass fabric (200 g/m$^2$, Finish Z 6040 from Dow Corning). This gives tack-free prepregs. 8 layers of the resulting prepreg are laminated at 180° C. and 50 bar to give a board. Test specimens 217 mm in length and 12.7 mm in width are sawn out from these boards. The thickness of the materials is about 1.6 mm,

Examples 6 to 8

Glass-fiber-reinforced laminates are prepared analogously using the epoxy resin solutions as in Examples 2, 3 and 4.

Fire performance was tested to the Underwriters Laboratories "Test for Flammability of Plastic Materials—UL 94" specification, May 2, 1975 issue. Table 1 shows the fire test results of the laminates as in Examples 4 to 8.

TABLE 1

| Laminate | Phosphorus-modified epoxy resin from | Afterflame time * | UL 94 classification |
|---|---|---|---|
| Example 5 | Example 1 | <1'; <1' | V-0 |
| Example 6 | Example 2 | <1'; 3' | V-0 |
| Example 7 | Example 3 | <1'; <1' | V-0 |
| Example 8 | Example 4 | <1'; <1' | V-0 |

TABLE 1-continued

\* After-flame time in seconds for which the material continues to burn, as in the UL 94 test.

The cured epoxy resins provided using the novel flame-retardant phosphorus-modified epoxy resins have outstanding flame retardancy.

What is claimed is:

1. A flame-retardant phosphorus-modified epoxy resin with an epoxy value of from 0.05 to 1.0 mol/100 g containing structural units derived from:
   (A) polyepoxy compounds having at least two epoxy groups per molecule, and
   (B) organic monoalkylated/arylated phosphinic acids.

2. A flame-retardant phosphorus-modified epoxy resin as claimed in claim 1, wherein the organic monoalkylated/arylated phosphinic acids have the formula (3)

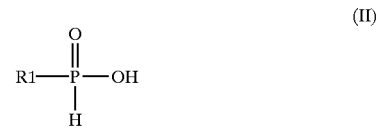

(II)

where in formula (II) R1 is an alkyl group having from 1 to 10 carbon atoms or an aryl group having from 2 to 10 carbon atoms.

3. A flame-retardant phosphorus-modified epoxy resin as claimed in claim 1, which contains, on average, at least one epoxy group.

4. A flame-retardant phosphorus-modified epoxy resin as claimed in claim 1, which contains from 1 to 8% by weight of phosphorus.

5. A process for preparing flame-retardant phosphorus-modified epoxy resins from epoxy resins and organic monoalkylated/arylated phosphinic acids as in formula (II), which comprises reacting the polyepoxy compounds of (A) and the organic monoalkylated/arylated phosphinic acids of (B) with one another.

6. The process as claimed in claim 5, wherein the reaction takes place in a solvent.

7. The process as claimed in claim 5, wherein polar aprotic solvents are used, for example N-methylpyrrolidone, dimethylformamide, tetrahydrofuran, dioxane, ethers, such as dialkyl ethers and glycol ethers, ketones, such as methyl ethyl ketone, and/or esters, such as ethyl acetate.

8. A process for preparing flame-retardant phosphorus-modified epoxy resins from epoxy resins and organic monoalkylated/arylated phosphinic acids as in formula (II) which comprises reacting the polyepoxy compounds of (A) and the organic monoalkylated/arylated phosphinic acids of (B) with one another, and wherein the reaction with the monoalkylated/arylated phosphinic acids as in formula (II) takes place first at temperatures from 80 to 120° C. until the acid function has been consumed in the reaction and then continues at temperatures of from 150 to 180° C., in the presence of catalysts.

9. The process as claimed in claim 8, wherein the catalysts comprise phosphonium salts, ammonium salts, metallocenes and/or Lewis acids.

10. The process as claimed in claim 5, wherein the ratio of equivalents between polyepoxy compound (A) and organic monoalkylated/arylated phosphinic acids (B) is from 1:0.1 to 1:1.

11. A method of producing moldings, composites, coatings or laminates comprising the step of incorporating the flame-retardant phosphosus-modified epoxy resin as claimed in claim 1 into moldings, composites, coatings or laminates.

12. A method of producing moldings, composites, coatings, or laminates comprising the step of incorporating the flame-retardant phosphorus-modified epoxy resins obtained by the process as claimed in claim 5, into moldings, composites, coatings or laminates.

13. A process for preparing flame-retardant phosphorus-modified epoxy resins from epoxy resins and organic monoalkylated/arylated phosphinic acids as in formula (II) which comprises reacting the polyepoxy compounds of (A) and the organic monoalkylated/arylated phosphinic acids of (B) with one another, and wherein the reaction with the phosphinic-acids as in formula (II) takes place in the presence of catalysts.

14. A method of producing moldings, composites, coatings, or laminates comprising the step of incorporating the flame-retardant phosphorus-modified epoxy resins obtained by the process as claimed in claim 13, into moldings, composites, coatings or laminates.

* * * * *